(12) United States Patent
Lin et al.

(10) Patent No.: US 6,486,032 B1
(45) Date of Patent: Nov. 26, 2002

(54) METHOD FOR FABRICATING CONTROL GATE AND FLOATING GATE OF A FLASH MEMORY CELL

(75) Inventors: Chih-Hui Lin, Taipei (TW); Chung-Lin Huang, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/174,672

(22) Filed: Jun. 18, 2002

(30) Foreign Application Priority Data

Dec. 28, 2001 (TW) ......................... 90132673 A (51) Int. Cl.⁷ ......................... H01L 21/8247
(52) U.S. Cl. ......................... 438/266; 438/594
(58) Field of Search ......................... 438/257, 258, 438/264, 267, 593, 594, 595

(56) References Cited

U.S. PATENT DOCUMENTS 6,174,771 B1 * 1/2001 Leu ......................... 438/594
6,284,596 B1 * 9/2001 Sung et al. ......................... 438/593
6,380,035 B1 * 4/2002 Sung et al. ......................... 438/594
6,441,429 B1 * 8/2002 Hsieh et al. ......................... 438/266

* cited by examiner

*Primary Examiner*—Chandra Chaudhari
(74) *Attorney, Agent, or Firm*—Merchant & Gould P.C.

(57) ABSTRACT

A method for fabricating the control gate and floating gate of a flash memory cell. An active area is firstly formed on a semiconductor substrate, followed by the formation of a first insulating layer, a first conductive layer and a first masking layer. A first opening is then formed by partially removing the first masking layer, and a floating gate oxide layer is formed by oxidation. The remaining first masking layer is removed, followed by forming a sacrificial layer, which is then partially removed to define a second opening. The remaining sacrificial layer is used as a hard mask to partially remove the first conductive layer and the first insulating layer to form a third opening. A second insulating layer is formed to fill the third opening to form an insulating plug. Part of the first conductive layer and the first insulating layer are removed to form a floating gate, followed by forming a third insulating layer and a second conductive layer. The insulating plug is then used as stop layer to remove part of the second conductive layer and third insulating layer to form a control gate.

16 Claims, 10 Drawing Sheets

METHOD FOR FABRICATING CONTROL GATE AND FLOATING GATE OF A FLASH MEMORY CELL

BACKGROUND OF THE INVENTION

1. Field of the Invention

The present invention relates to a method for fabricating a flash memory cell. In particular, the invention involves the formation of control gate and floating gate of a flash memory cell.

2. Description of the Prior Art

Complementary metal oxide semiconductor (CMOS) memory is generally categorized into two groups: random access memory (RAM) and read only memory (ROM). RAM is a volatile memory, wherein the stored data disappears when power is off. On the contrary, turning off power does not affect the stored data in a ROM.

In the past few years, market share of ROM has been continuously expanding, and the type attracting the most attention has been flash memory. The fact that a single memory cell is electrically programmable and multiple memory cell blocks are electrically erasable allows flexible and convenient application that are superior to electrically programmable read only memory (EPROM), electrically erasable programmable read only memory (EEPROM) and programmable read only memory (PROM). Furthermore, fabricating flash memory is cost effective. Having the above advantages, flash memory has been widely applied in consumer electronic products, such as digital cameras, digital video cameras, mobile phones, notebooks, personal stereos and personal digital assistant (PDA).

Since portability of these electrical consumer products is strongly prioritized by consumers, the size of the products must be minimal. As a result, capacity of flash memory must increase, and functions must be maximized while sizes thereof are continuously minimized. Having an increased amount of access data, capacity of memory cells has been enhanced from 4 to 256 MB, and even 1 G byte will become the market trend in the near future. Masks are essential in conventional processes for fabricating flash memory, even for the most critical process of floating gate and control gate.

Figure 1A:
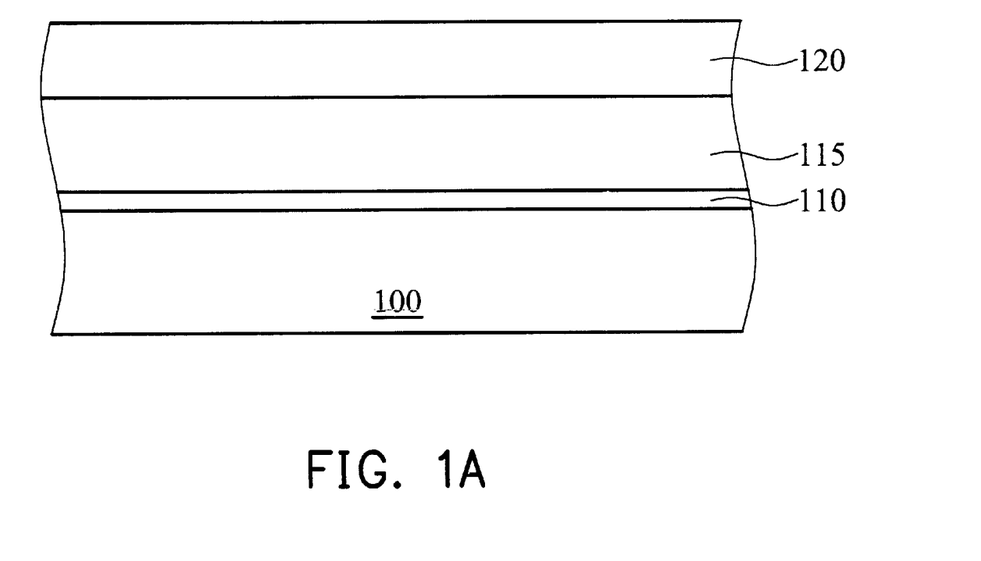
FIGS. 1A~1G illustrate the conventional process of fabricating control gate and floating gate of a flash memory cell.

Conventional process for a split gate flash memory cell is further explained with references to FIGS. 1A~1G. In FIG. 1A, a p-type silicon substrate 100 is thermal oxidized by local oxidation (LOCOS) to form a field isolation region (not shown). An active area is then formed by separating the field isolation region. Next, a first gate insulating layer 110 is formed on the surface of the substrate 100 within the active area using silicon oxide. Polysilicon is then formed by chemical vapor deposition on the first gate insulating layer 110, followed by doping with suitable dopants to form a first conductive layer 115. Then, a first masking layer 120 is formed using silicon nitride on the first conductive layer 115.

Figure 1B:
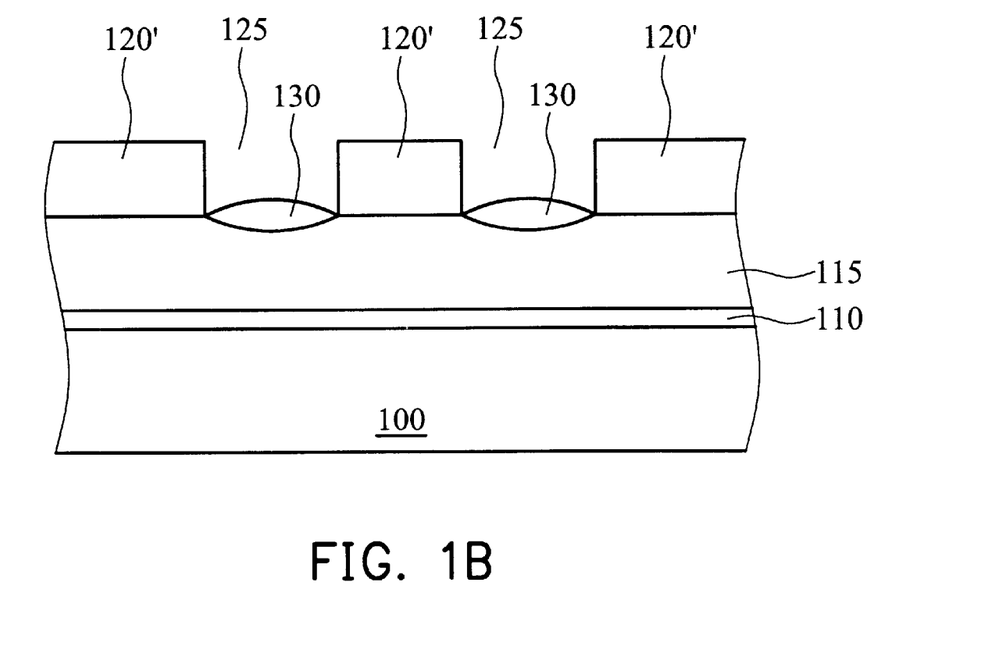

In FIG. 1B, photolithography and etching are performed to remove part of the first masking layer 120, thus defining a first opening 125 and exposing the first conductive layer 115. The remaining first masking layer is represented by 120'. Oxidation is then performed to transform the exposed first conductive layer 115 to an oxide, which is represented by a first insulating layer 130.

Figure 1C:
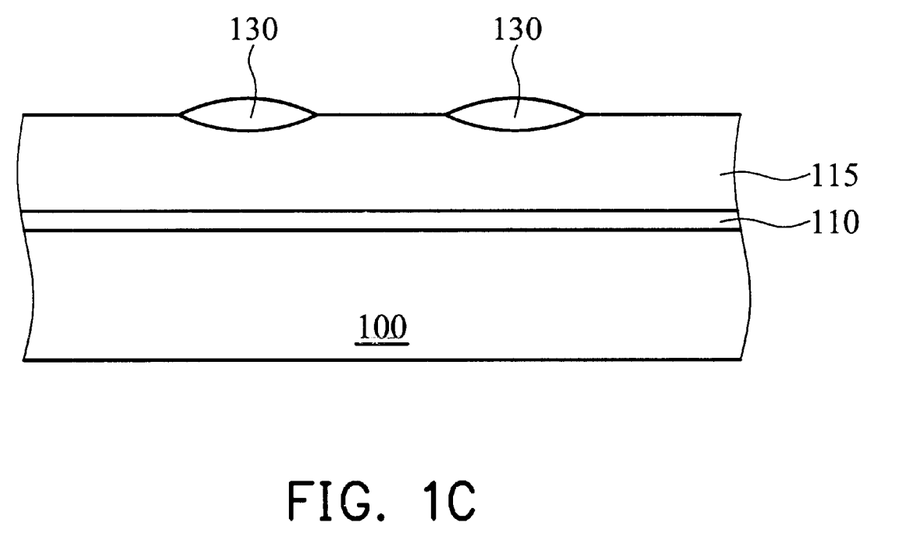

Next, in FIG. 1C, isotropic etching is carried out to remove the remaining first masking layer 120'.

Figure 1D:
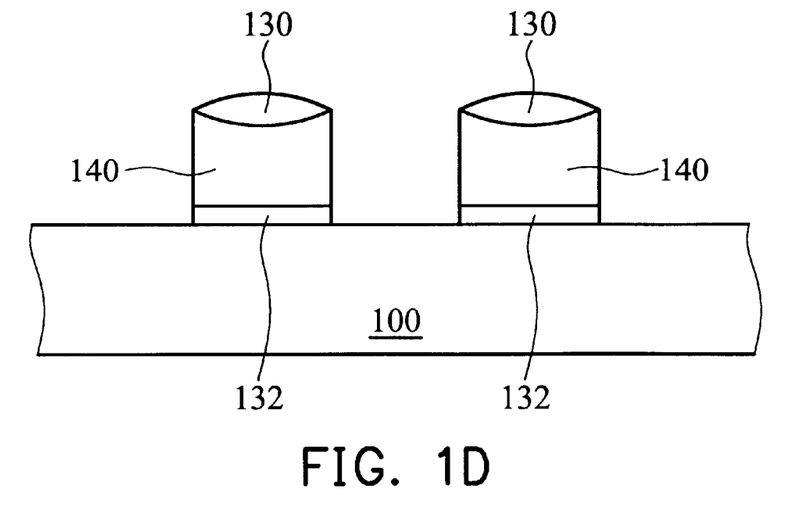

The first insulating layer 130 is then used as hard mask to perform anisotropic etching, as shown in FIG. 1D, where part of the first conductive layer 115 and the first insulating layer 110 are removed. The first conductive layer 115 and the first insulating layer 110 underneath the first insulating layer 130 remain and the substrate 100 is exposed. The remaining first conductive layer 115 thus forms a floating gate 140, and the remaining first insulating layer 110 forms a first gate insulating layer 132.

Figure 1E:
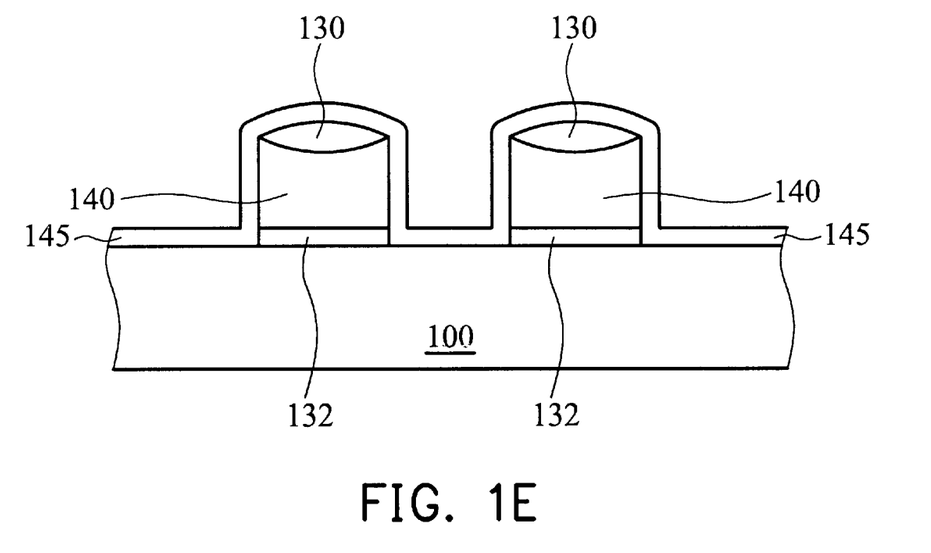

Oxidation or chemical vapor deposition (CVD) is then carried out to form a silicon oxide as the second insulating layer 145, which covers the substrate 100 and surface of the first insulating layer 130 and sidewalls of the floating gate 140 and the first gate insulating layer 132, as shown in FIG. 1E.

Figure 1F:
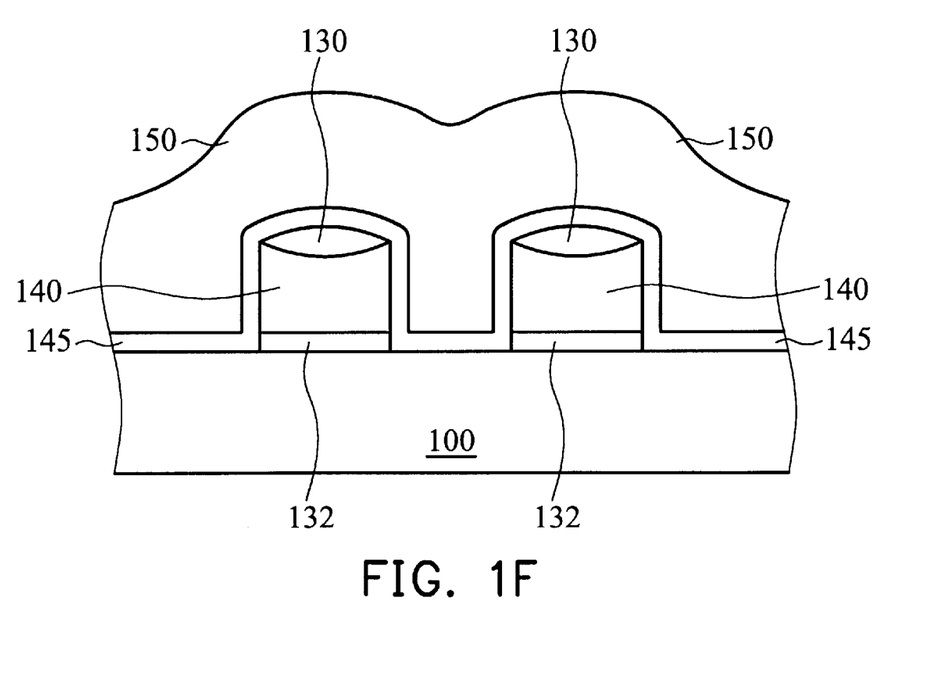

Next, chemical vapor deposition is performed to deposit a layer of polysilicon as the conductive layer covering the second insulating layer 145. The conductive layer is then doped with dopant to become conductive, which is represented by the second conductive layer 150, as shown in FIG. 1F.

Figure 1G:
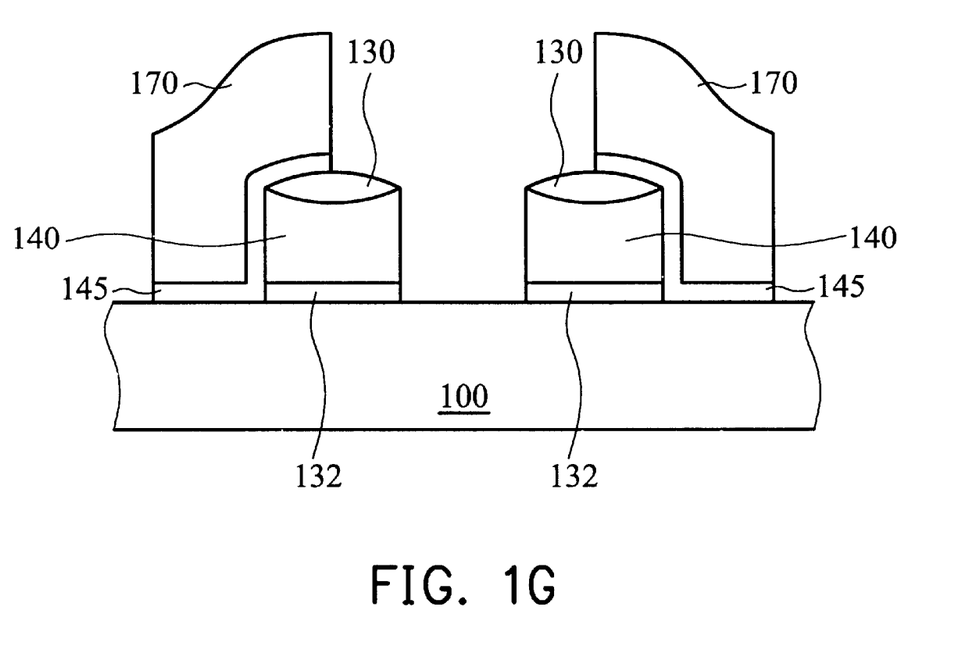

Photolithography and etching are then accomplished to remove part of the second conductive layer 150 and the second insulating layer 145. The remaining second conductive layer 150 is the control gate 170, and the remaining second insulating layer 145 forms the second gate insulating layer 175. The fabrication of control gate and floating gate are completed at this stage.

Due to the rapid advancement of the integration of memory, the sizes of all elements must be continuously decreased to achieve high integration. Conventional fabrication of flash memory relies upon masks for define sizes and positions of elements, but limitations of mask alignment. causes problems for finer line width, where alignments are difficult. Even tiny misalignment causes shorts for semiconductor elements. Consequently, devices cannot function properly as designed.

Fabrication of memory involves many steps, and production cycles usually last for weeks, even months. Electrical defects are usually not found until later stages. Therefore, when defects caused by misalignment are detected, a great quantity of partially completed products with defects are on the process line, which causes serious losses. Hence, it is the best to be able to handle defects in advance.

SUMMARY OF THE INVENTION

In order to overcome the above problems, the invention uses a self-alignment process to form an insulating plug between two floating gates, thus defining the position to form a control gate. This results in easy control of the process and sizes of the control gates and avoids the influence of line width. The length at the bottom of the control gate is consequently assured, which improves the conventional fabrication of flash memory. By having this insulating plug, disagreement among lengths of control gates caused by misalignment when forming control gates is avoided, thus the characteristics of flash memory are improved. The method provided in this invention is useful in fabricating highly-integrated flash memory, wherein defects caused by misalignment in conventional processes are avoided.

The present invention provides a method for fabricating control gate and floating gate of a memory cell, which comprises the following steps: providing a semiconductor substrate; forming a field insulating layer on the surface of the semiconductor substrate to define an active area; forming a first insulating layer on the substrate within the active area; forming a first conductive layer on the first insulating layer; forming a masking layer on the first conductive layer;

removing part of the first masking layer to define a first opening and to expose the surface of the first conductive layer; forming a first gate insulating layer on the exposed surface of the first conductive layer by oxidation; removing part of the first masking layer to expose the surface of the first conductive layer; forming a sacrificial layer on the first conductive layer to cover the first gate insulating layer; removing the sacrificial layer between the neighboring first gate insulating layers within the active area to define a second opening and to expose surfaces of the first conductive layer and part of the first gate insulating layer; using the remaining sacrificial layer and the first gate insulating layer as a hard mask to remove the first conductive layer and the first insulating layer within the second opening to form another opening and to expose the surface of the substrate, wherein the opening together with the second opening form a third opening; forming a second insulating layer on surface of the remaining sacrificial layer to fill the third opening; using the remaining sacrificial layer as stop layer to remove the second insulating layer remains on the surface of the sacrificial layer without removing the part within the third opening, which forms an isolating plug; removing the remaining sacrificial layer to expose the remaining first conductive layer and a partial surface of the first gate insulating layer; using the first gate insulating layer and the insulating plug as a hard mask to remove the first conductive layer and the first insulating layer not covered by the first gate isolating layer and the isolating plug, wherein the remaining first conductive layer forms a floating gate and the remaining first insulating layer forms the second gate insulating layer; forming a third insulating layer on surface of the substrate to cover the surface of the first gate insulating layer, the surface and sidewalls of the insulating plug and the sidewalls of the floating gate and the second gate insulating layer; forming a second conductive layer on the surface of the third insulating layer; and using the isolating plug as stop layer to remove part of the second conductive layer and the third insulating layer to expose the the surface of the top part of the insulating plug and the surface of the substrate, wherein the remaining second conductive layer forms a control gate and the remaining third insulating layer forms a tunneling oxide.

The present invention will become more fully understood from the detailed description given hereinbelow and the accompanying drawings, given by way of illustration only and thus not intended to be limitative of the present invention.

DETAILED DESCRIPTION OF THE INVENTION

Figure 2A:
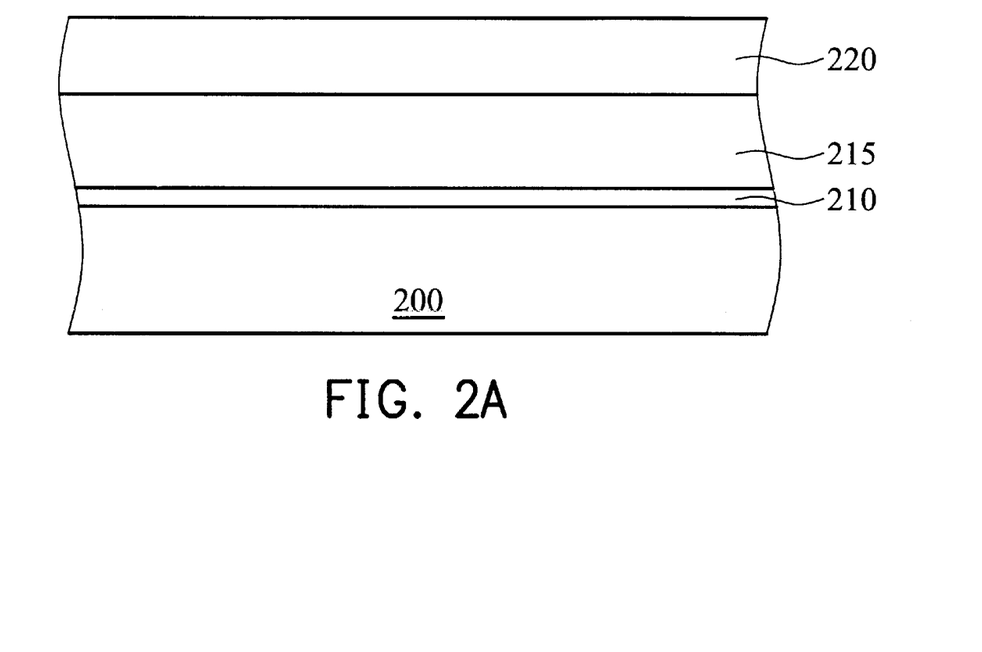
FIGS. 2A~2L illustrate the process of fabricating control gate and floating gate of a flash memory cell according to an embodiment of this invention.

In FIG. 2A, 200 represents a semiconductor substrate, such as Si or Ge. The substrate can be, for example, epitaxy silicon or silicon on insulator (SOI). In a p-type Si substrate for example, shallow trench isolation (STI) or region oxidation is performed to form a field insulating layer (not shown) on the p-type substrate 200. An active area (not shown) is then separated from the insulating layer. A first insulating layer 210 is formed on the surface of the substrate 200 within the active area with a thickness of 50~200 angstroms. The first insulating layer can be, for example, silicon oxide, silicon nitride, or silicon oxynitride formed by oxidation. Next, a first conductive layer 215, with a thickness of 1000~2000 angstroms, is formed on the first insulating layer 210. The first conductive layer 215 is polysilicon formed by chemical vapor deposition (CVD). To make the polysilicon layer conductive, diffusion or ion implantation is performed to dope As ions or P ions. In-situ implantation is also applicable to form the doped polysilicon. Then, a first masking layer 220 is formed by low pressure CVD on the first conductive layer 215, with a thickness of 500~3000 angstroms. This layer can be, for example, silicon nitride or silicon oxide.

Figure 2B:
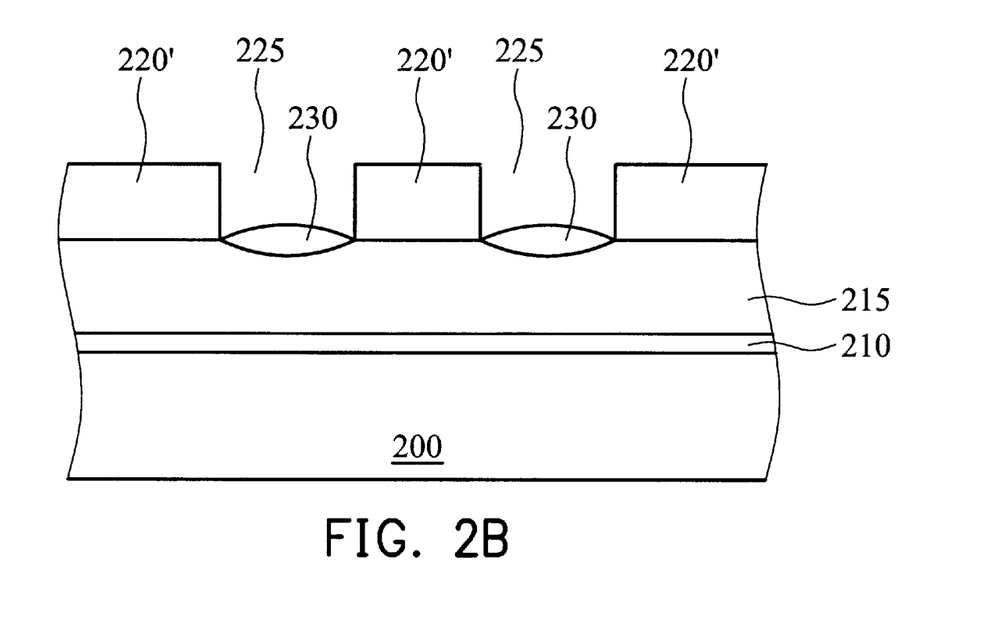

In FIG. 2B, photolithography and etching are performed to partially remove the masking layer 220 to define a first opening 225 to expose the surface of the first conductive layer 215. The remaining masking layer 220 is now represented by remaining masking layer 220'. Next, oxidation is performed to oxidize the exposed first conductive layer 215 to form a first gate insulating layer 230.

Figure 2C:
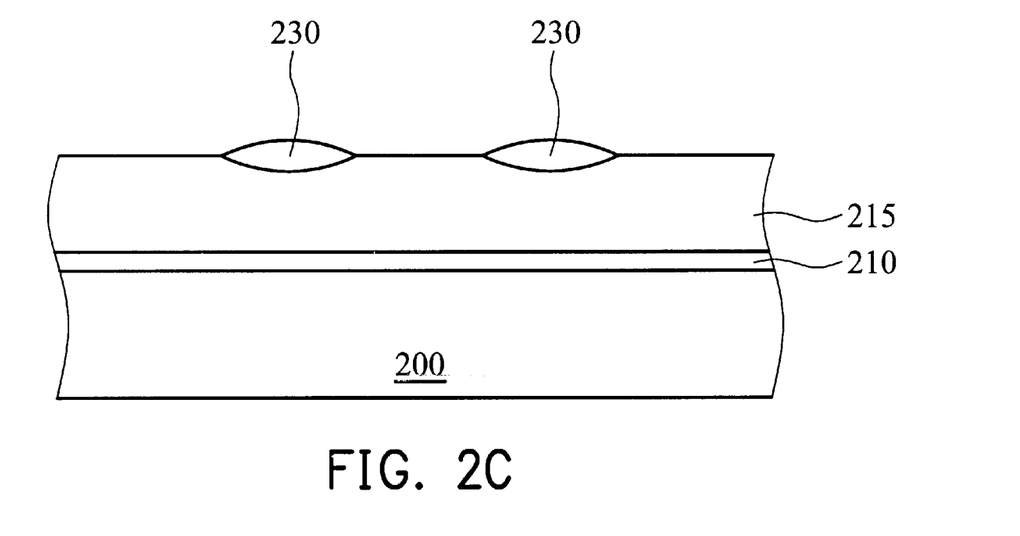

Etching is then performed, as shown in FIG. 2C, to remove the remaining masking layer 220' to expose the first conductive layer 215 underneath. Etching in this step is preferably isotropic etching.

Figure 2D:
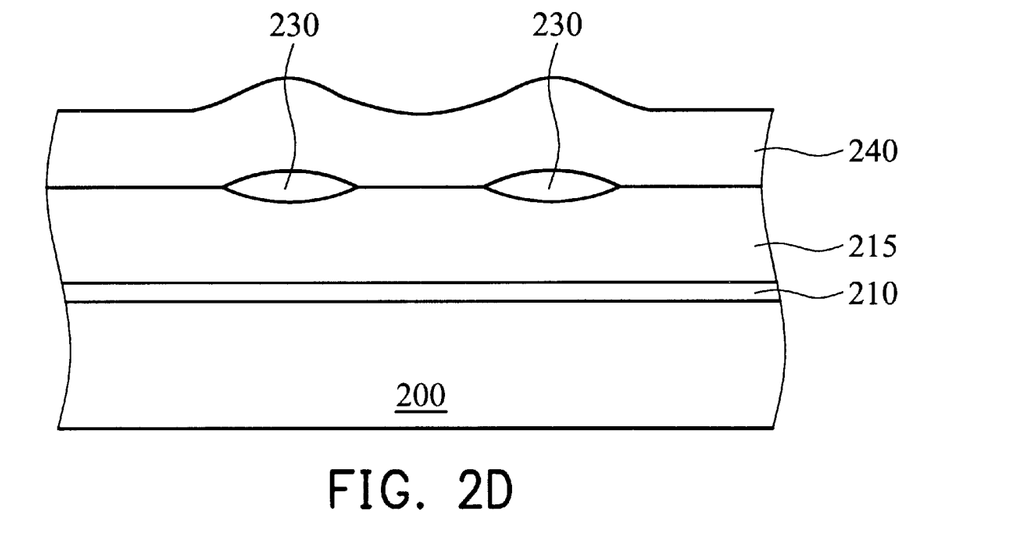

In FIG. 2D, a sacrificial layer 240 is formed on the first conductive layer 215 to cover the first gate insulating layer 230. The sacrificial layer 240 is silicon nitride or silicon oxynitride formed by low pressure CVD, with a thickness of 3500~5000 angstroms.

Figure 2E:
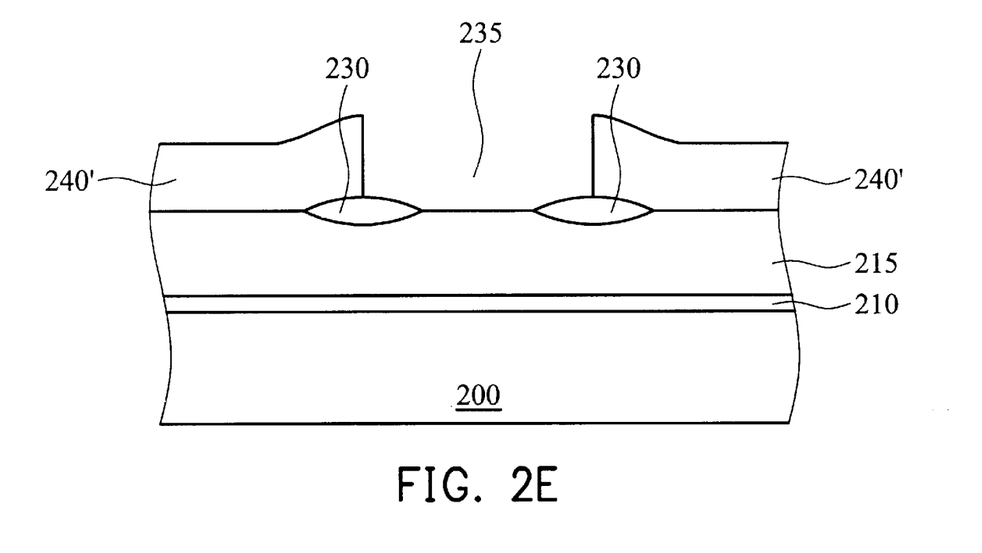

Next, photolithography and etching are performed to remove the sacrificial layer 240 located between the neighboring first gate insulating layers 230 within the active area to define a second opening 235, as shown in FIG. 2E. The first conductive layer 215 and part of the first gate insulating layer 230 are exposed. The remaining sacrificial layer 240 is represented by remaining sacrificial layer 240'. Etching in this step is anisotropic.

Figure 2F:
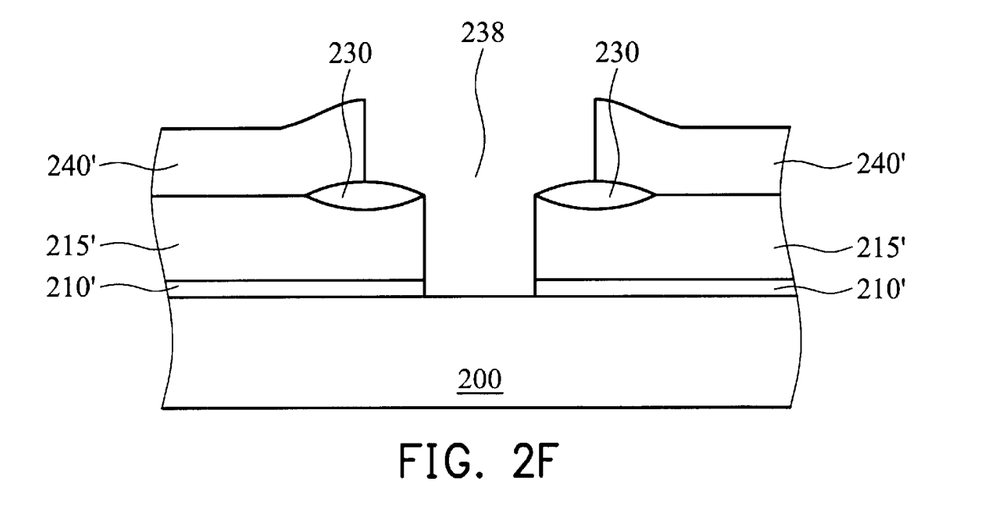

In FIG. 2F, using the remaining sacrificial layer 240' and the first gate insulating layer 230 as a hard mask to perform etching, the first conductive layer 215 and the first insulating layer 210 at the bottom of the second opening 235 are removed. A new opening is thus formed, with the substrate 200 exposed. This opening with the second opening 235 form a third opening 238. Etching at this stage is anisotropic. The first conductive layer 215 and the remaining first insulating layer 210 are now represented by remaining first conductive layer 215' and remaining first insulating layer 210'. Next, N type ions such as P or Ar ions are doped in the substrate 200, thus forming a drain (not shown) on the substrate 200 within the third opening 238.

Figure 2G:
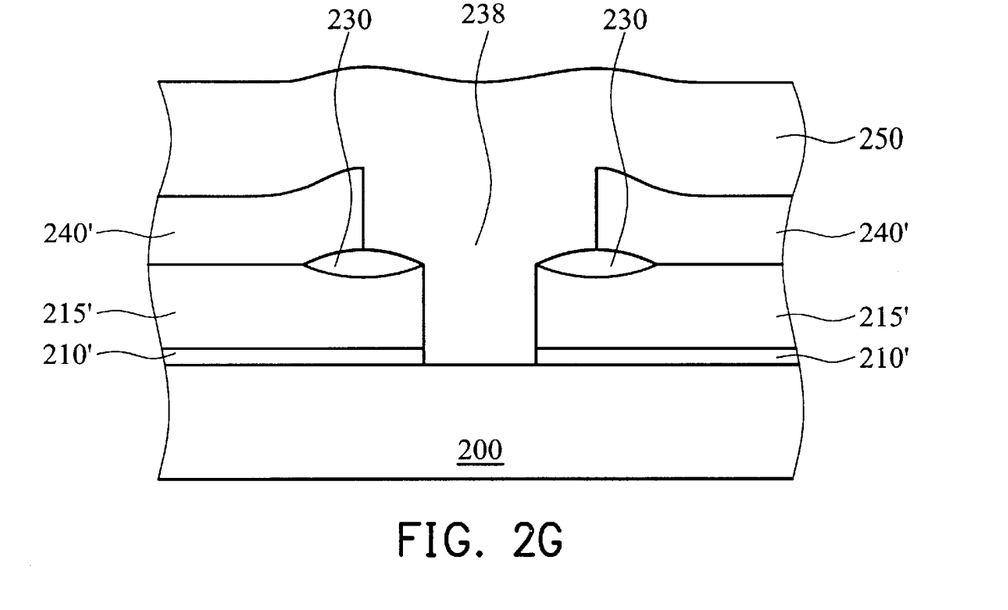

Then, a second insulating layer 250 is formed on the remaining sacrificial layer 240' to fill the third opening 238, as shown in FIG. 2G. The second insulating layer 250 is silicon oxide, silicon nitride or silicon oxynitride formed by low pressure CVD, with a thickness of 4000~7000 angstroms.

Figure 2H:
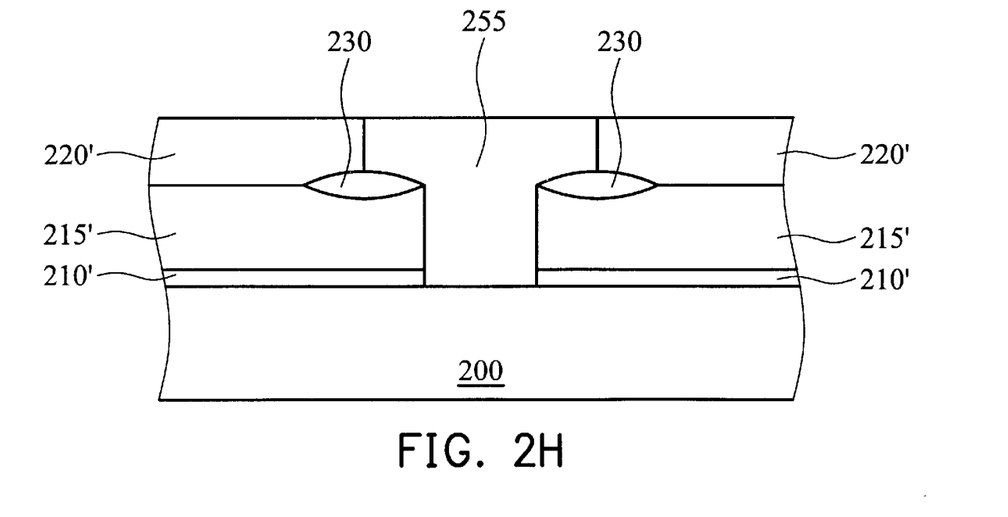

Using the remaining sacrificial layer 240' as stop layer, the second insulating layer 250' on the remaining sacrificial layer 240' is planarized, as shown in FIG. 2H. The portion within the third opening 238 is not removed. The remaining second insulating layer 250 is represented by insulating plug 255. The planarization process is preferably performed by chemical mechanical polishing (CMP) or anisotropic etching.

Figure 2I:
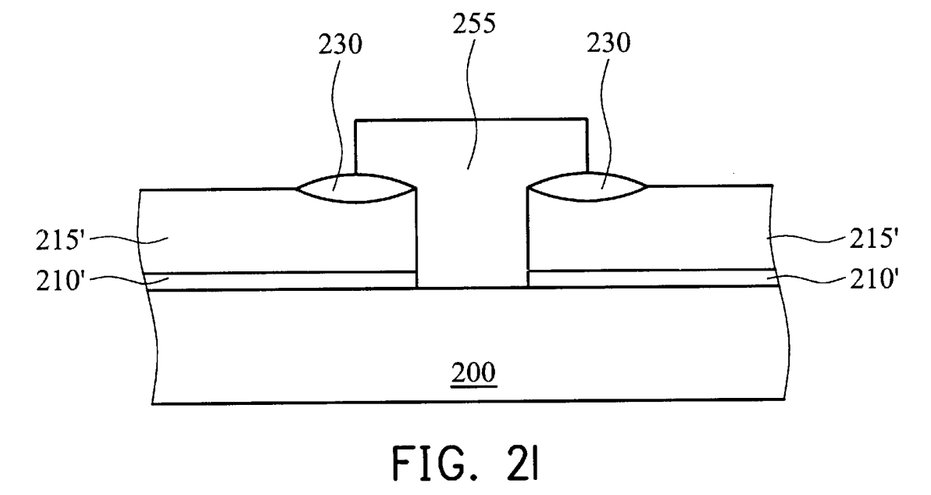

In FIG. 2I, etching is carried out to remove the remaining sacrificial layer 240' to expose the remaining first conductive layer 215' and a partial surface of the first gate insulating layer 230. Etching in this step is isotropic wet etching.

Figure 2J:
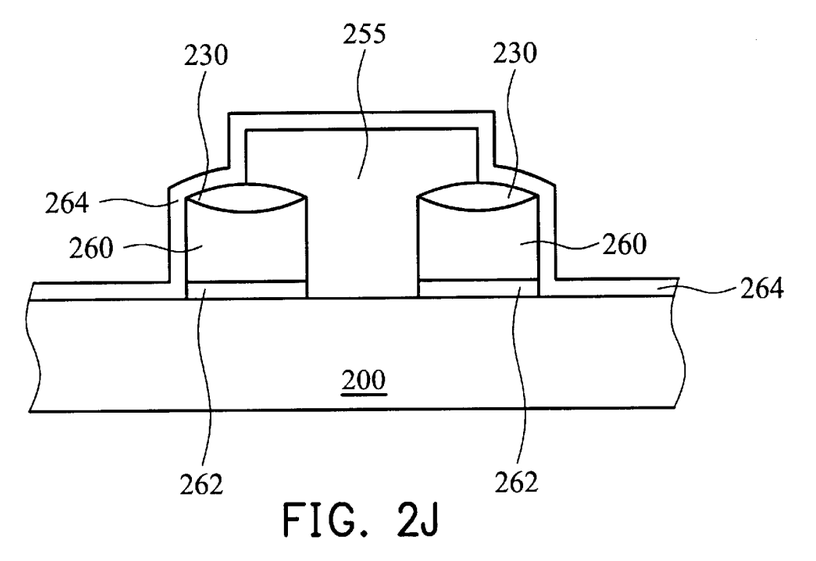

Etching is again performed, using the first gate insulating layer 230 and insulating plug 255 as a hard mask, to remove the remaining first conductive layer 215 and the remaining first insulating layer 210' not covered by the first gate insulating layer 230 and insulating plug 255, as shown in FIG. 2J. The remaining first conductive layer 215' forms a floating gate 260, and the remaining first insulating layer 210' forms a second gate insulating layer 262. A third insulating layer 210' is formed on the substrate 200 to cover surface of the first gate insulating layer 230, surface and sidewalls of the insulating plug 255 and sidewalls of the floating gate 260 and the second gate insulating layer 262. The third insulating layer 264 is silicon oxide, silicon nitride or silicon oxynitride formed by low pressure CVD or thermal oxidation, with a thickness of 100~500 angstroms.

Figure 2K:
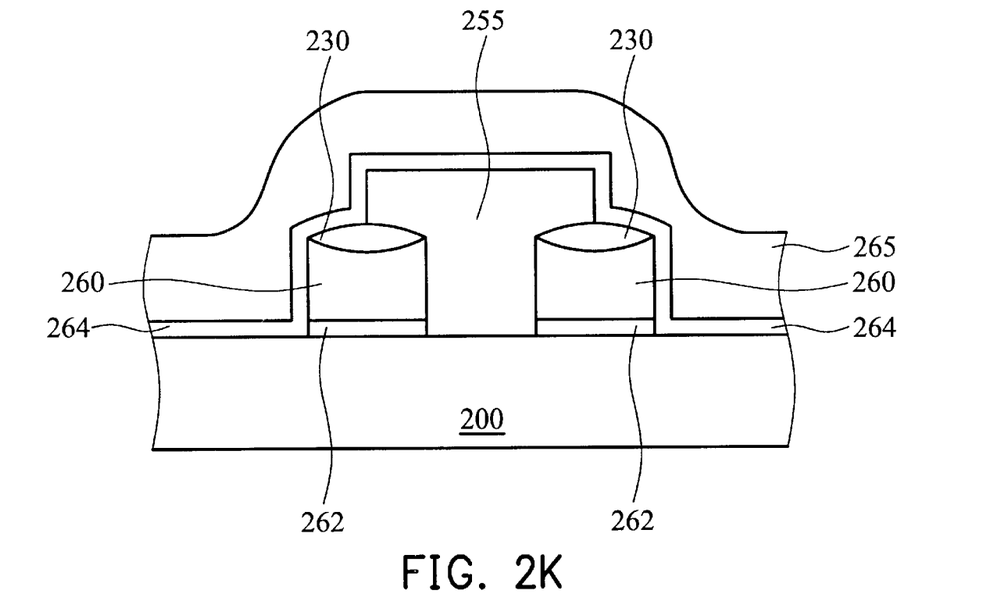

Next, in FIG. 2K, a second conductive layer 265 is formed on the third insulating layer 264. The second conductive layer can be polysilicon formed by CVD. Diffusion or ion implantation with As or P ions can be performed to make the layer conductive. In-situ implantation is also applicable to form doped polysilicon, with a thickness of 3000~6000 angstroms.

Figure 2L:
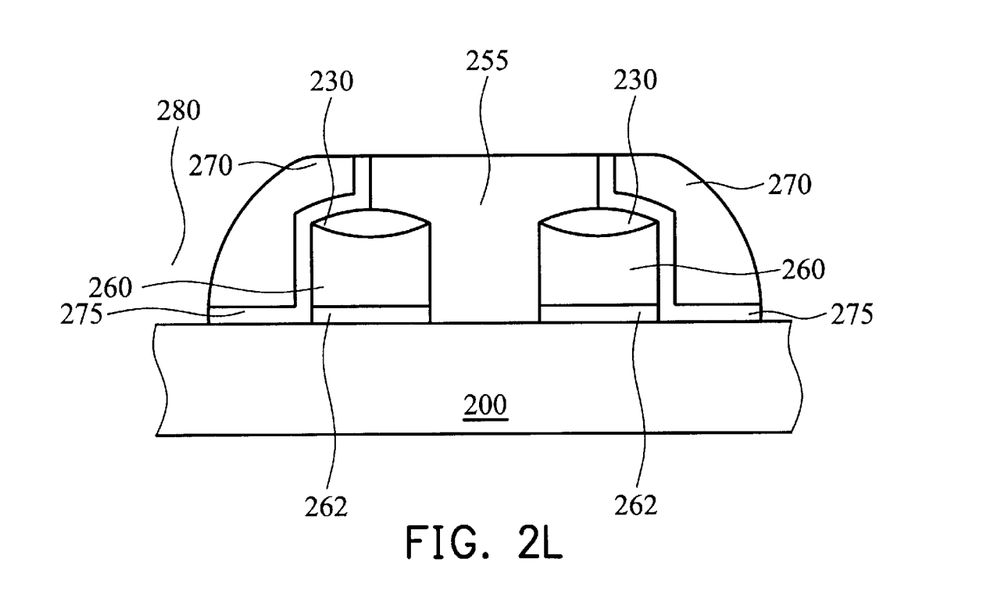

The insulating plug 255 is then used as stop layer, as shown in FIG. 2L, to perform etching, thus removing part of the second conductive layer 265 and third insulating layer 264 to form a fourth opening 280. The top surface of the insulating plug 255 and surface of the substrate 200 are then exposed. The remaining second conductive layer 265 forms a control gate 270. The remaining third insulating layer 264 forms a tunneling oxide 275. Etching at this step is anisotropic. Next, N type ions such as P or Ar ions are doped in the substrate 200, thus forming a source (not shown) on the substrate 200 within the fourth opening 280. This completes the fabrication of a control gate 270 and a floating gate 260 of a flash memory cell.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating control gate and floating gate of a flash memory cell, comprising:

providing a semiconductor substrate;

forming a field insulating layer on the surface of the semiconductor substrate to define an active area;

forming a first insulating layer on the substrate within the active area;

forming a first conductive layer on the first insulating layer;

forming a masking layer on the first conductive layer;

removing part of the first masking layer to define a first opening and to expose the surface of the first conductive layer;

forming a first gate insulating layer on the exposed surface of the first conductive layer by oxidation;

removing part of the first masking layer to expose the surface of the first conductive layer;

forming a sacrificial layer on the first conductive layer to cover the first gate insulating layer;

removing the sacrificial layer between the neighboring first gate insulating layers within the active area to define a second opening and to expose surfaces of the first conductive layer and part of the first gate insulating layer;

using the remaining sacrificial layer and the first gate insulating layer as a hard mask to remove the first conductive layer and the first insulating layer within the second opening to form another opening and to expose the surface of the substrate, wherein the opening together with the second opening form a third opening;

forming a second insulating layer on surface of the remaining sacrificial layer to fill the third opening;

using the remaining sacrificial layer as a stop layer to remove the second insulating layer remaining on the surface of the sacrificial layer without removing the part within the third opening, which forms an isolating plug;

removing the remaining sacrificial layer to expose the remaining first conductive layer and a partial surface of the first gate insulating layer;

using the first gate insulating layer and the insulating plug as hard mask to remove the first conductive layer and the first insulating layer not covered by the first gate isolating layer and the isolating plug, wherein the remaining first conductive layer forms a floating gate and the remaining first insulating layer forms the second gate insulating layer;

forming a third insulating layer on surface of the substrate to cover the surface of the first gate insulating layer, the surface and sidewalls of the insulating plug and the sidewalls of the floating gate and the second gate insulating layer;

forming a second conductive layer on the surface of the third insulating layer; and using the isolating plug as a stop layer to remove part of the second conductive layer and the third insulating layer to expose the surface of the top part of the insulating plug and surface of the substrate, wherein the remaining second conductive layer forms a control gate and the remaining third insulating layer forms a tunneling oxide.

2. The method as claimed in claim 1, wherein the semiconductor substrate is silicon substrate.

3. The method as claimed in claim 1, wherein the first conductive layer is doped polysilicon.

4. The method as claimed in claim 1, wherein the thickness of the first conductive layer is 1000~2000 Å.

5. The method as claimed in claim 1, wherein the second conductive layer is doped polysilicon.

6. The method as claimed in claim 1, wherein the thickness of the second conductive layer is 3000~6000 Å.

7. The method as claimed in claim 1, wherein the masking layer is either silicon nitride or silicon oxynitride.

8. The method as claimed in claim 1, wherein the thickness of the masking layer is 500~3000 Å.

9. The method as claimed in claim 1, wherein the sacrificial layer is either silicon nitride or silicon oxynitride.

10. The method as claimed in claim 8, wherein the thickness of the sacrificial layer is 3500~5000 Å.

11. The method as claimed in claim 1, wherein the first insulating layer is either silicon nitride or silicon oxynitride.

12. The method as claimed in claim 1, wherein the thickness of the first insulating layer is 500~2000 Å.

13. The method as claimed in claim 1, wherein the second insulating layer is either silicon nitride or silicon oxynitride.

14. The method as claimed in claim 1, wherein the thickness of the second insulating layer is 4000~7000 Å.

15. The method as claimed in claim 1, wherein the third insulating layer is either silicon nitride or silicon oxynitride.

16. The method as claimed in claim 1, wherein the thickness of the third insulating layer is 100~500 Å.

* * * * *